(12) United States Patent
Derner et al.

(10) Patent No.: US 7,142,446 B2
(45) Date of Patent: Nov. 28, 2006

(54) APPARATUS AND METHOD TO REDUCE UNDESIRABLE EFFECTS CAUSED BY A FAULT IN A MEMORY DEVICE

(75) Inventors: Scott J. Derner, Boise, ID (US); Stephen R. Porter, Boise, ID (US); Scot M. Graham, Boise, ID (US); Ethan A. Williford, Boise, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 17 days.

(21) Appl. No.: 10/902,728

(22) Filed: Jul. 29, 2004

(65) Prior Publication Data

US 2006/0023493 A1 Feb. 2, 2006

(51) Int. Cl.
*G11C 11/24* (2006.01)
(52) U.S. Cl. ...................... 365/149; 365/226
(58) Field of Classification Search ............. 365/149
See application file for complete search history.

(56) References Cited

U.S. PATENT DOCUMENTS

| | | | |
|---|---|---|---|
| 4,610,002 A * | 9/1986 | Kaneko | 365/189.06 |
| 6,049,495 A | 4/2000 | Hsu et al. | |
| 6,127,878 A | 10/2000 | Hanson et al. | |
| 6,392,942 B1 * | 5/2002 | Noda et al. | 365/205 |
| 6,535,430 B1 | 3/2003 | Ogura et al. | |
| 6,556,503 B1 | 4/2003 | Schreck | |
| 6,850,454 B1 * | 2/2005 | Kuge et al. | 365/227 |
| 2005/0281099 A1 * | 12/2005 | Lovett | 365/194 |

* cited by examiner

*Primary Examiner*—Thong Q. Le
(74) *Attorney, Agent, or Firm*—Edward L. Pencoske; Jones Day (57) ABSTRACT

A method and apparatus is provided for reducing the current in a memory device. Peripheral device control signals are translated to the wordline off voltage level, such as a negative wordline voltage. The translated signals prevent the peripheral devices from conducting current in the wordline off mode, even if a wordline-to-digitline short should occur. The control signals may include a column select signal for a column select device and an active pull-up signal for a sense amplifier, among others. Additionally, an equalization circuit having high and low resistance components is provided for the memory device. The equalization circuit limits current, even if a wordline-to-digitline short occurs.

32 Claims, 9 Drawing Sheets

APPARATUS AND METHOD TO REDUCE UNDESIRABLE EFFECTS CAUSED BY A FAULT IN A MEMORY DEVICE

BACKGROUND OF THE INVENTION

The present invention relates generally to reducing the amount of power consumed by an integrated circuit and more particularly to reducing the power consumed by a dynamic random access memory (DRAM) during a fault condition.

Typical memory devices are comprised of a plurality of memory cells, each storing one bit of data. The memory cells may be arranged in arrays; each memory cell, for example, connected to a wordline and a digitline. The memory device may also include peripheral devices, such as drivers, sense amps, input/output devices, and power supplies, etc., that are used to locate memory cells, access the memory cells, and store information within and read information from the memory cells, among others.

The amount of data that is stored by a memory device is limited by the number of memory cells that comprise the memory device. The number of memory cells within a given area of a memory device may be referred to as the cell density. An increase in cell density typically results in an increase in the amount of data that can be stored by a device. Thus, circuit designers continually try to increase the cell density, for example, by decreasing the size of each memory cell and/or freeing some of the space occupied by the peripheral circuits so that additional memory cells can be provided on the memory device. Increasing cell density, however, has created several problems. For example, current leakage though the cell access devices (e.g., sense amps, column select devices, input/output devices, etc.) has increased with decreasing cell access transistor geometries.

One method of reducing current leakage through the cell access devices includes driving the wordlines to a negative voltage. Negative wordline voltage (NEGWL) refers to a wordline voltage that is less than GROUND potential, for example, between −0.1 and −1 volts. A typical NEGWL for the current state of the art devices may be between −0.3 and −0.5 volts. Reducing current leakage using NEGWL, however, creates additional problems should a wordline-to-digitline short occur. More specifically, driving the wordline to a negative wordline voltage may increase the amount of current that flows through a fault (e.g., a short circuit) and/or may increase the current that flows though other peripheral circuits (e.g., the sensing devices), for example, while in a standby mode.

Thus, there exists a need for an apparatus and method for reducing current flow in a memory device during a fault (such as a wordline-to-digitline short), for reducing the current leakage through peripheral circuits, and that overcomes the other limitations inherent in prior art.

SUMMARY OF THE INVENTION

Methods and apparatus for reducing the current that flows through a DRAM peripheral device are provided. For example, control signals to which the peripheral devices are responsive are translated to the wordline voltage level. The translated signals prevent the peripheral devices from conducting current should a wordline-to-digitline short occur. The control signal may be a column select signal for a column select device and an active pull-up signal for a sense amplifier, among others. Additionally, circuits having a high resistance component are provided which reduce the current should a wordline-to-digitline short occur.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION OF THE INVENTION

Figure 1:
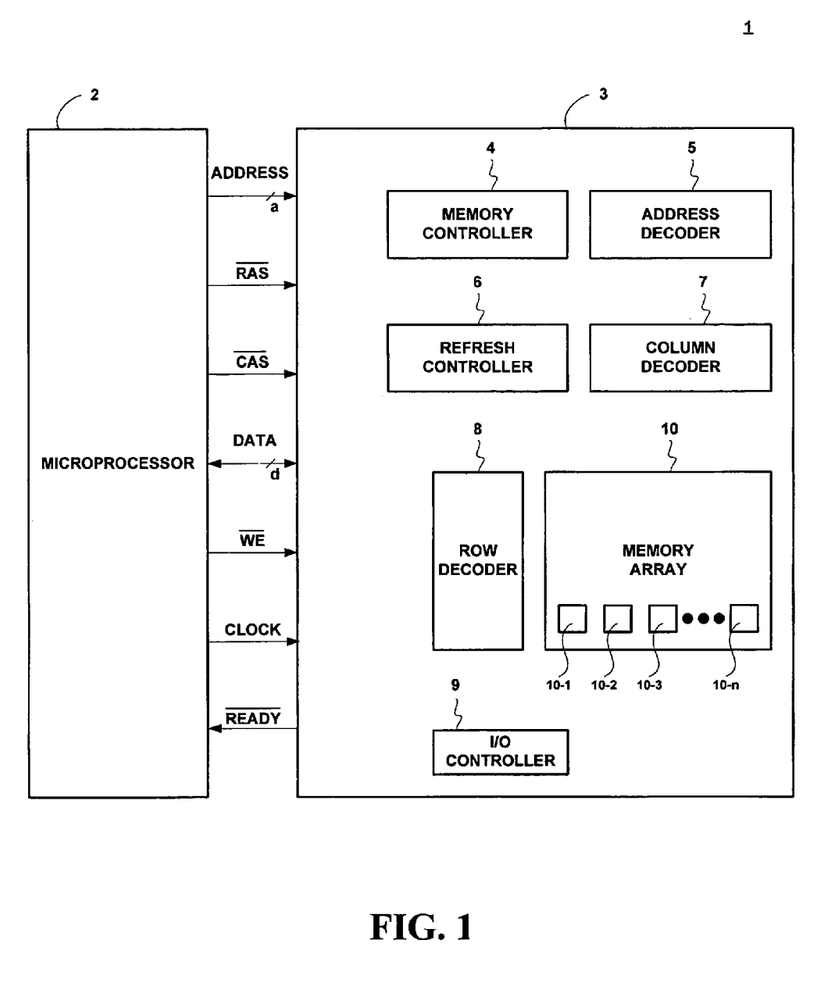
FIG. 1 illustrates a block diagram of a system using a DRAM according one embodiment.

FIG. 1 illustrates a block diagram of a system 1 comprised of a microprocessor, micro-controller, ASIC, etc. 2 in communication with a dynamic random access memory (DRAM) 3. The DRAM 3 may be, for example, a static dynamic random access memory (SDRAM), a pseudo-static random access memory (PSRAM), and a low-power, extended-refresh dynamic random access memory (LP-DRAM), among others. As shown in FIG. 1, various signals are shared between the processor 2 and the DRAM 3. For example, cell address (ADDRESS) signals, a row address strobe ($\overline{RAS}$), a column address strobe ($\overline{CAS}$), data (DATA) signals, a write enable ($\overline{WE}$) signal, a timing (CLOCK) signal, and a DRAM ready ($\overline{READY}$) signal are shown. It should be apparent to one skilled in the art that the illustrated signals are for exemplary purposes only and not intended to limit the present invention.

The DRAM 3 is comprised of a main memory array 10 and other support circuitry. The DRAM main memory array 10 may be further divided into a number of sub-arrays (i.e., 10-1, 10-2, 10-3, . . . 10-*n*). Those of ordinary skill in the art will recognize that support circuitry may include a memory controller 4, an address decoder 5, a refresh controller 6, a column decoder 7, a row decoder 8, and an input/output (I/O) controller 9, among other components for writing information into and reading information out from main memory array 10. Additionally, those of ordinary skill in the art will recognize that other support circuitry may be included which are not disclosed in detail as they do not form a feature of the present invention.

Figure 2:
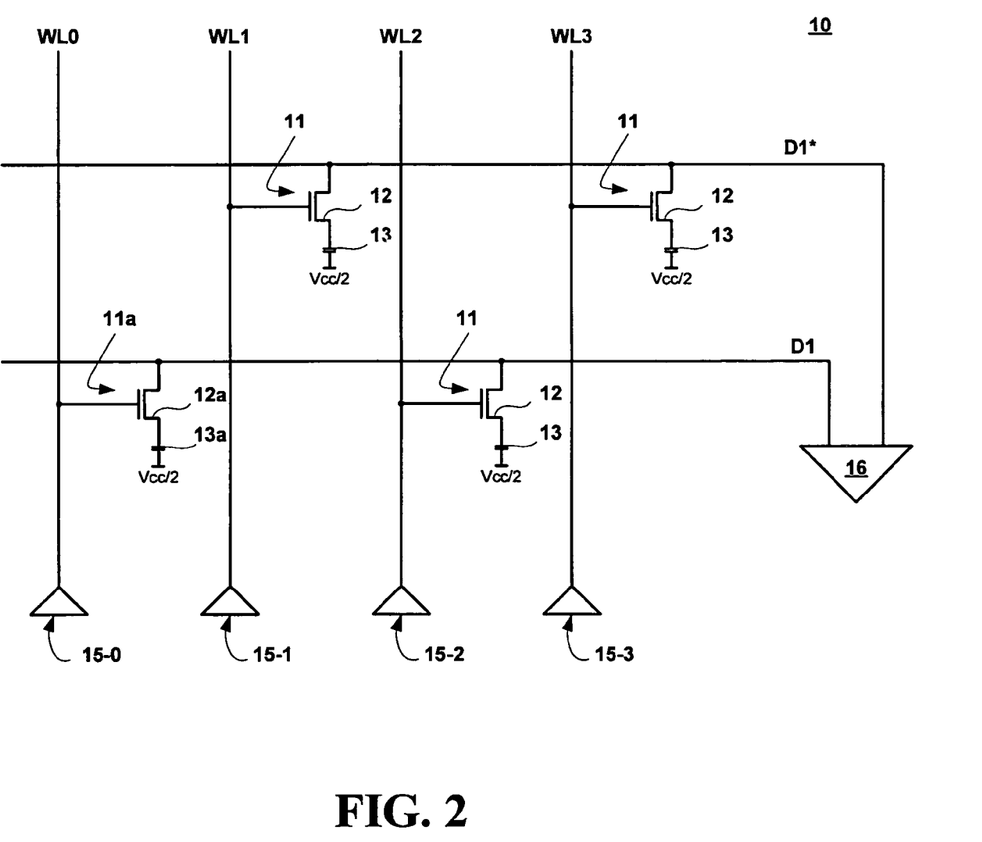
FIG. 2 is a simplified schematic of a portion of the dynamic random access memory (DRAM) array of FIG. 1.

FIG. 2 is a simplified schematic of a portion of a dynamic random access memory (DRAM) array 10 of FIG. 1. The DRAM array 10 illustrated may be referred to as a folded digitline array, however, it should be apparent to those skilled in the art that other DRAM architectures (for example, an open digitline DRAM array) may be used while remaining within the scope of the present invention.

The array 10 is comprised of a plurality of memory cells or memory bits (mbit) 11, each of which includes a mbit transistor 12 and a storage capacitor 13. The mbits 11 are capable of holding binary information in the form of stored charge on the capacitors 13. The mbit transistors 12 operate as a switch interposed between the mbit capacitors 13 and the digitlines D1, D1*. Some times D1 and D1* are referred to as a "digit line" or as a "digit line pair." If the latter, then each is a digitline. The mbit transistors 12 are operated (i.e., activated/deactivated) using signals supplied on an associated wordline (e.g., WL0, WL1, WL2, WL3) via wordline drivers 15 (e.g., 15-0, 15-1, 15-2, 15-3).

Accessing an mbit 11 results in charge sharing between the accessed mbit capacitor 13 and its corresponding digitline D1, D1*. If the accessed mbit capacitor 13 contains a stored logic one (e.g., Vcc), the charge sharing causes the voltage on the corresponding digitline D1, D1* to increase. If the accessed mbit capacitor 13 contains a stored logic zero (e.g., GROUND), the charge sharing causes the voltage on the corresponding digitline D1, D1* to decrease. The digitlines D1, D1* are connected to the peripheral devices 16 which are used, for example, to access the mbit 11 and to determine whether the charge stored therein was a logic one or a logic zero. It should be apparent to one skilled in the art that size of the array 10 illustrated in FIG. 2 (i.e., with four mbits 11, four wordlines WL0, WL1, WL2, WL3, and one digitline pair D1, D1*) was chosen for clarity and arrays having a different size and layout are within the scope of the present invention.

Figure 3:
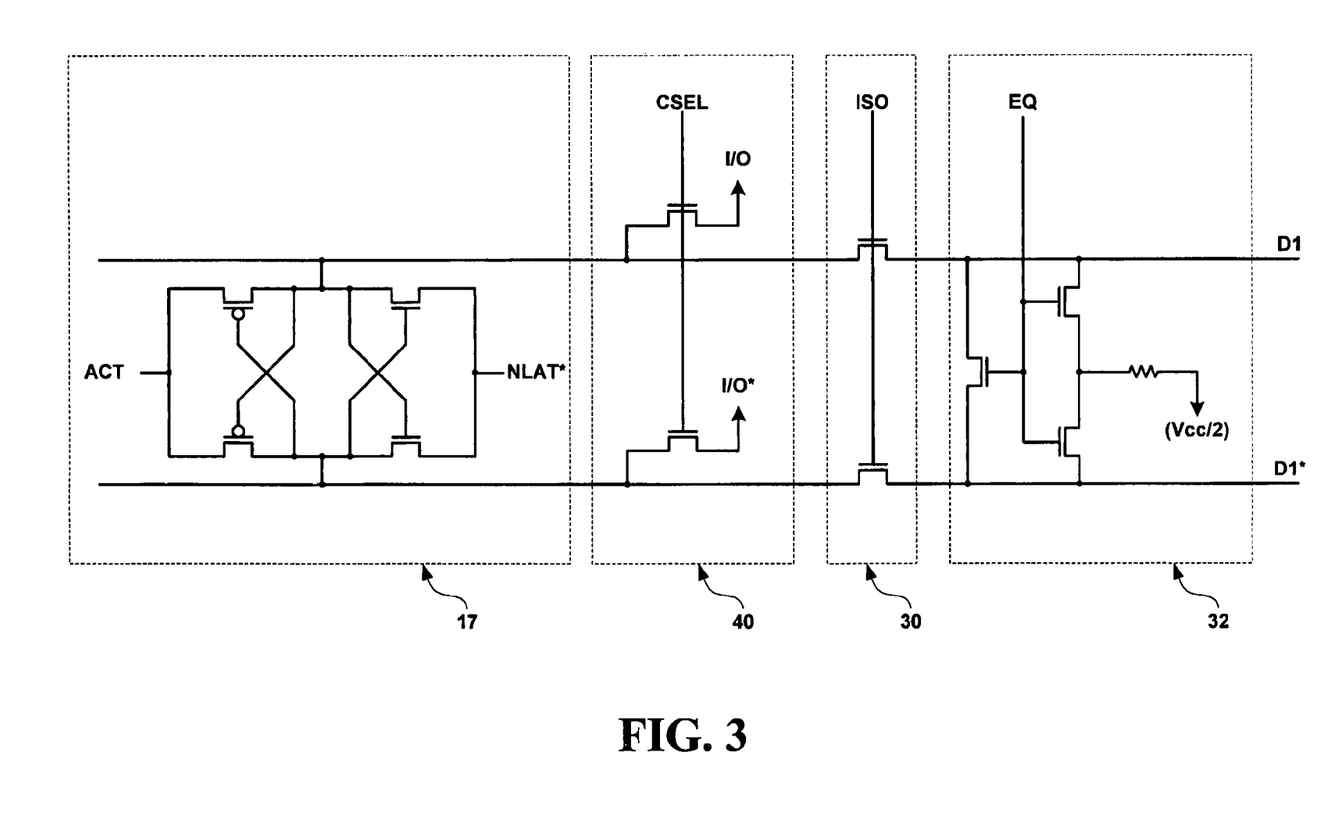
FIG. 3 is a simplified schematic illustrating certain of the peripheral devices that may be used in conjunction with the DRAM array of FIG. 2.

FIG. 3 is a simplified schematic illustrating some of the peripheral devices 16 that may be used in conjunction with the DRAM array of FIG. 2. The peripheral devices may include a sense amplifier 17, a column select device 40, an isolation device 30, and a digitline equalization device 32, among others. The function of each of these devices is discussed in more detail below.

Returning to FIG. 2, assume that mbit 11a (i.e., the mbit located at the intersection digitline D1 and wordline WL0) is being accessed during a read operation. First, the digitlines D1, D1* are precharged to a predetermined voltage level by connecting the digitlines D1, D1* to a voltage source. For example, the digitlines are precharged to a voltage level of approximately Vcc/2 using the equalization device 32 shown in FIG. 3 to connect the digitlines D1, D1* to voltage source Vcc/2. The digitlines D1, D1* are then isolated from the voltage source (for example, using isolation device 30 as shown in FIG. 3), however due to inherent capacitance, the digitlines D1, D1* float at approximately Vcc/2. The associated wordline driver (here, wordline driver 15-0) then drives wordline WL0 to a voltage that is at least one transistor threshold voltage (Vth) above Vcc. This voltage level may be referred to as Vccp or Vpp. This voltage activates mbit transistor 12a and allows charge sharing between mbit capacitor 13a and digitline D1.

If the mbit capacitor 13a contains a stored logic one (e.g., Vcc), the charge sharing causes the voltage on digitline D1 to increase. If the mbit capacitor 13a contains a stored logic zero (e.g., GROUND), the charge sharing causes the voltage on digitline D1 to decrease. It should be noted that digitline D1* remains substantially at the precharge level Vcc/2 (the voltage of digitline D1* may change slightly due to parasitic coupling with, for example, D1 and WL0). The differential voltage between the digitlines D1, D1* is read or sensed by a sense amplifier (for example, the sense amplifier 17 shown in FIG. 3). Sensing generally refers to the amplification of the differential voltage between digitlines D1, D1* (i.e., the digitline signal). Because the differential voltage developed between digitlines D1 and D1* is used to read the mbit 11 contents, digitlines D1 and D1* are often referred to as a digitline pair.

Figure 4:
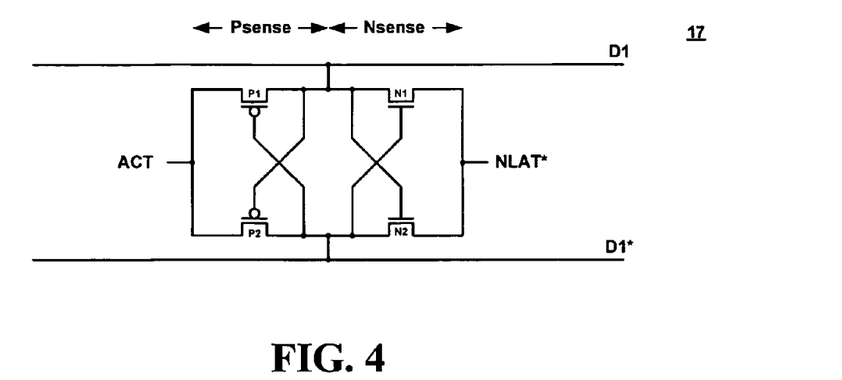
FIG. 4 is a detailed view of the sense amplifier illustrated in FIG. 3.

FIG. 4 is a more detailed view of the sense amplifier 17 illustrated in FIG. 3. Sense amplifier 17 includes a pair of cross-coupled nMOS transistors N1, N2 (which make up an Nsense-amp) and a pair of cross-coupled pMOS transistors P1, P2 (which make up a Psense-amp). The source of each nMOS transistor N1, N2 is connected at a common node driven by compliment Nsense-amp latch control signal (NLAT*). The control signal NLAT* is used to enable the Nsense-amp. The gate terminal of nMOS transistor N2 and the drain terminal of nMOS transistor N1 are connected to digitline D1, whereas the gate terminal of NMOS transistor N1 and the drain terminal of nMOS transistor N2 are connected to digitline D1*.

Similarly, the source of each pMOS transistor P1, P2 is connected at a common node driven by an active pull-up control signal (ACT). The control signal ACT is used to enable the Psense amp. The gate terminal of pMOS transistor P2 and the drain terminal of pMOS transistor P1 are connected to digitline D1, whereas the gate terminal of pMOS transistor P1 and the drain terminal of pMOS transistor P2 are connected to digitline D1*. It should be apparent to those skilled in the art that other arrangements for the sense amplifier 17 may be used while remaining within the scope of the present invention.

In most DRAM's, NLAT* is set at approximately Vcc/2 during standby mode. Thus, when the digitlines D1, D1* are precharged to Vcc/2 as discussed above, the gate-to-source voltage (Vgs) across the nMOS transistors N1, N2 is eliminated and current leakage from the digitlines D1, D1* through the nMOS transistors N1, N2 to NLAT* is prevented (i.e., drain-to-source current through the transistors N1 and N2 is prevented). In contrast, ACT is typically set at GROUND in standby mode. Thus, when the digitlines D1, D1* are precharged to approximately Vcc/2 as discussed above, there is no negative gate-to-source voltage (Vgs) across the pMOS transistors P1, P2 and current leakage from the digitlines D1, D1* through the pMOS transistors P1, P2 to ACT is prevented (i.e., drain-to-source current through the transistors P1 and P2 is prevented).

Figure 5:
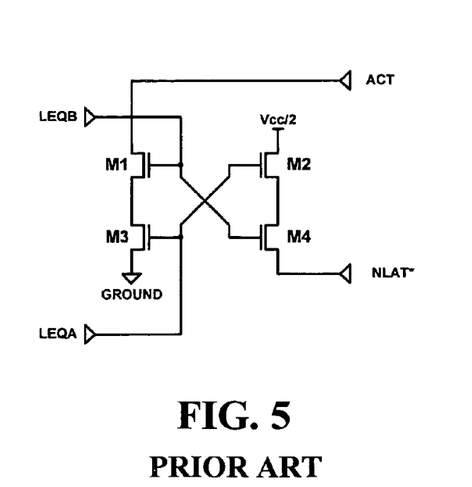
FIG. 5 is a schematic of a circuit for supplying control signals to a sense amplifier according to the prior art.

FIG. 5 illustrates a schematic of a circuit for supplying ACT and NLAT* to a sense amplifier according to the prior art. In standby mode, the equalization signals LEQA and LEQB are high causing ACT to be pulled to GROUND through transistors M1 and M3 and NLAT* to be driven to Vcc/2 through transistors M2 and M4. When equalization signals LEQA and LEQB are low, ACT and NLAT* are disconnected from GROUND and Vcc/2, respectively. Although this circuit prevents current leakage when digitlines D1, D1* are precharged to approximately Vcc/2, a problem arises should a wordline-to-digitline short occur. When the sense amplifier is activated, LEQA and LEQB are driven low and additional circuits (not shown) are then used to drive ACT from GROUND to Vcc and NLAT* from Vcc/2 to GROUND.

As discussed above, wordlines are turned off to a negative voltage (NEGWL) to overcome issues associated with increased mbit density. Should a wordline-to-digitline short or fault occur, the shorted digitline is pulled to NEGWL and the gate voltage of the pMOS transistor connected to the shorted digitline is also pulled to NEGWL. Accordingly, a negative gate-to-source voltage (Vgs) is created across this pMOS transistor (i.e., the voltage NEGWL on the gate is less than the GROUND voltage of the source set by ACT). Because a negative gate-to-source voltage (i.e., Vgs) exists, the short circuit current may increase and a NEGWL to GROUND current may occur through this pMOS transistor to the ACT node.

Figure 6:
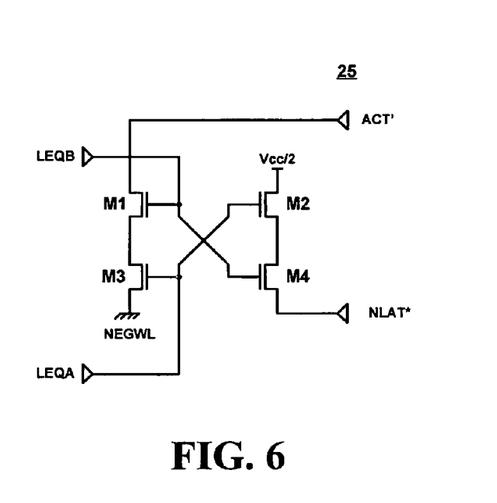
FIG. 6 is a schematic of a circuit for supplying a translated control signal to the sense amplifier of FIG. 3 according to one embodiment.

FIG. 6 is a schematic of a circuit 25 for supplying a translated active pull-up control signal (ACT') and compliment Nsense-amp latch signal NLAT* to the sense amplifier 17 of FIG. 3 according to one embodiment.

In standby mode, the equalization signals LEQA and LEQB are high causing ACT' to be translated to NEGWL (where NEGWL is, for example, between −0.1 and −1 volts) through transistors M1 and M3 and NLAT* to be driven to Vcc/2 through transistors M2 and M4. In another embodiment, ACT' may be translated to a voltage that is lower than the voltage on the wordlines. When equalization signals LEQA and LEQB are low, transistors M1, M3 and M2, M4, respectively, are turned off and ACT' and NLAT* are disconnected from NEGWL and Vcc/2, respectively. When the sense amp is activated, LEQA and LEQB are driven low and additional circuits (not shown) are used to drive ACT' from NEGWL to Vcc and NLAT* from Vcc/2 to GROUND. In the current embodiment, should a wordline-to-digitline short occur, a negative gate-to-source voltage (Vgs) cannot develop across the pMOS transistors because ACT' is translated to NEGWL (i.e., the voltage at the source of pMOS transistors M1 and M3 will be less than or equal to the voltage on their respective gates). By preventing the negative Vgs, the short circuit current does not increase and a drain-to-source current cannot occur through the pMOS transistors of circuit 25.

Returning to FIG. 4, the operation of the sense amplifier 17 will now be discussed according to the present embodiment. While the digitlines D1, D1* are being precharged (e.g., to voltage approximately Vcc/2 as discussed above), the sense amp 17 is in standby mode (i.e., both nMOS transistors N1, N2 are turned off by holding NLAT* at Vcc/2 and both pMOS transistors P1, P2 are turned off by translating ACT to NEGWL). When an mbit 11 is accessed, for example mbit 11a as discussed above, a signal develops across the digitlines D1, D1*. For example, assume that mbit capacitor 13a contains a logic one (i.e., Vcc). When wordline WL0 is fired, mbit transistor 12a is activated and the voltage stored by mbit capacitor 13a is shared with digitline D1. Because mbit capacitor 13a contains a logic one, the voltage on digitline D1 increases. Meanwhile, the voltage on digitline D1* remains substantially unchanged and thus digitline D1* may be used as a reference.

During a sensing operation, the sense amplifier 17 typically operates by sequentially activating the Nsense-amp (first) and the Psense-amp (last). The Nsense-amp is fired by bringing NLAT* from Vcc/2 to GROUND (e.g., using additional circuitry not shown). The nMOS transistor N2 (with its gate connected to the higher voltage digitline D1) begins to conduct, causing the lower voltage digitline (here D1*) to discharge toward NLAT*. The nMOS transistor N1 remains off.

After the Nsense-amp fires, the Psense-amp is fired by bringing ACT' from NEGWL towards Vcc. The pMOS transistor P1 (with its gate connected to digitline D1* which has been discharged to NLAT*) begins to conduct, causing the high-voltage digitline (here D1) to charge toward ACT'. The mbit capacitor 13a is then charged back to a full level (here Vcc for logic one). The pMOS transistor P2 remains off. After being charged, the mbit capacitor 13a is isolated by turning off the mbit transistor 12a. NLAT* and ACT' are then driven back to their standby mode levels (i.e., to Vcc/2 and NEGWL, respectively).

Although the sensing operation discussed above was described using a logic one stored on the mbit capacitor, it should be apparent to one skilled in the art that the sense amp 17 may operate in a similar manner for a mbit capacitor storing a logic zero. Additionally, it should be apparent to one skilled in the art that the current example is in no way intended to limit the present invention and that other circuits, voltages, structures, operations, etc. may be used while remaining within the scope of the present invention. Furthermore, although the present embodiment is described in conjunction with eliminating current flow caused by a fault while one or more peripheral devices is in a standby mode, it should be apparent to one skilled in the art that the present invention is applicable to preventing current flow through peripheral devices that are in other modes of operation.

Figure 7:
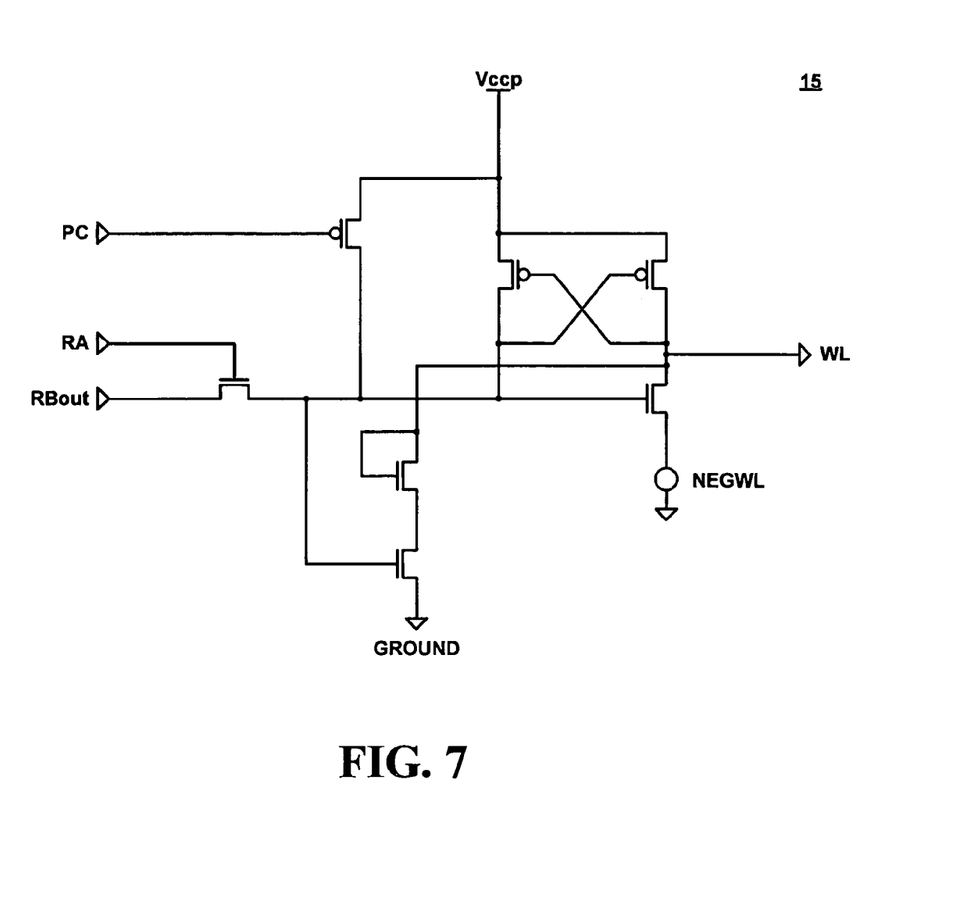
FIG. 7 is a circuit schematic for a wordline driver for supplying a negative wordline voltage to the wordlines illustrated in FIG. 2 according one embodiment.

FIG. 7 is a circuit schematic for a wordline driver for supplying the NEGWL to the wordlines illustrated in FIG. 2 according one embodiment. The wordlines are typically driven to NEGWL when the wordline is in a standby mode (i.e., not being fired by the wordline driver 15). The wordline driver does not form a feature of the present invention, however, the reader desiring more information regarding the wordline driver shown in FIG. 7 is directed to U.S. patent application Ser. No. 10/232,953, entitled "System and Method for Negative Word Line Driver Circuit" filed 29 Aug. 2002, which is hereby incorporated by reference.

Figure 8:
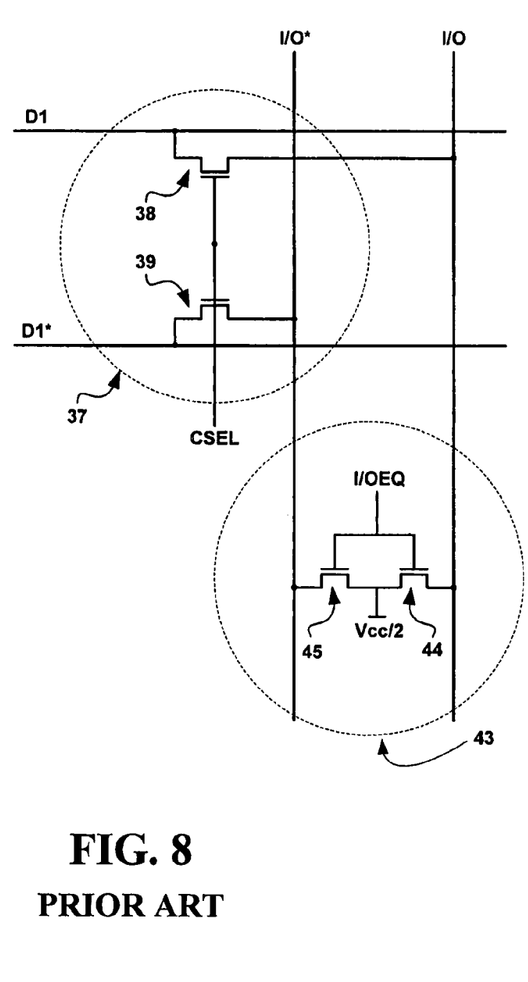
FIG. 8 is a schematic of a column select device and input/output equalization circuit according to the prior art.

FIG. 8 is a detailed view of a column select device 37 and input/output (I/O) equalization circuit 43 according to the prior art. The column select device 37 uses a pair of nMOS transistors 38, 39 to select the digitline pair to be connected to the input/output lines (I/O, I/O*). As illustrated in FIG. 8, the gate of each nMOS transistor 38, 39 is connected to a column select control signal (CSEL). The source and drain of transistor 38 are connected to digitline D1 and input/output line I/O, respectively, whereas the source and drain of transistor 39 are connected to digitline D1* and input/output line I/O*, respectively.

Upon entering standby mode, an I/O equalization device 43 is used to tie the input/output lines I/O, I/O* to Vcc/2. Typically, the equalization device 43 is comprised of one or more low resistance components, for example, low resistance nMOS transistors 44, 45. As illustrated in FIG. 8, the source and gate of each nMOS transistor 44, 45 is connected to Vcc/2 and an input/output equalization signal (I/OEQ), respectively. The drain terminal of NMOS transistor 44 is connected to input/output line I/O, whereas the drain terminal of nMOS transistor 45 is connected to input/output line I/O*.

As discussed above, the wordlines are typically driven to NEGWL. Thus, a wordline-to-digitline short causes current leakage through the CSEL device 39. For example, if a wordline-to-digitline short occurs between a wordline and digitline D1, digitline D1 will be pulled to NEGWL causing transistor 38 to conduct. Thus, current flows from the I/O equalization device 43, through the column select device 37, and to the short. More specifically in the present example, current flows from Vcc/2, through equalization transistor 44, and onto input/output line I/O. The current continues to flow from the input/output line I/O, through transistor 38 onto digitline D1, and from digitline D1 to the shorted wordline. Because the equalization device 43 uses low resistance transistors 44, 45 and because the column select device 37 used the non-translated control signal CSEL, the amount of current that flows when a wordline-to-digitline short occurs is large.

Figure 9:
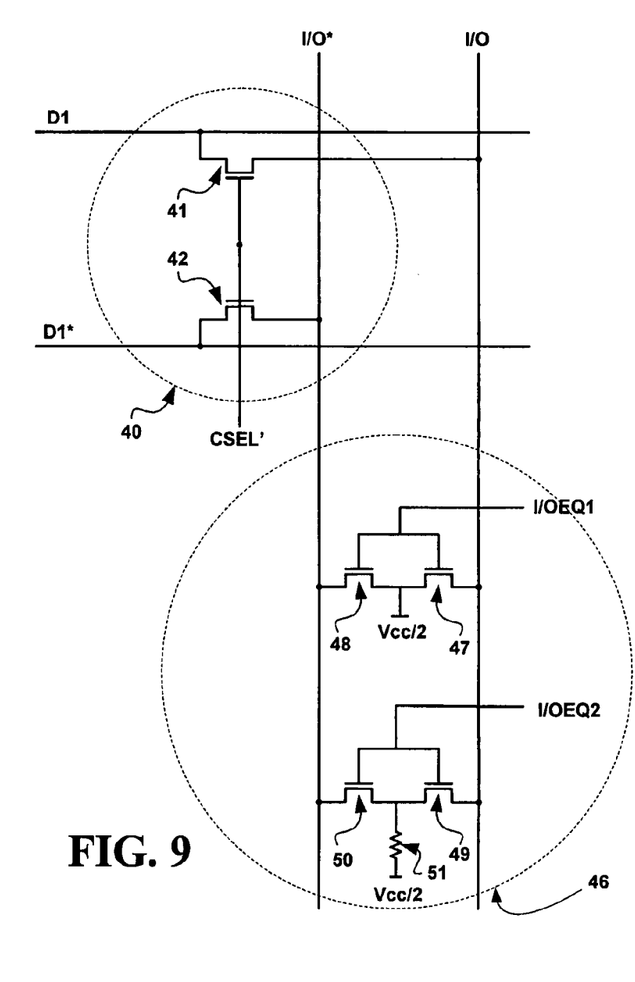
FIG. 9 is a detailed view of the column select device shown in FIG. 3 and an input/output equalization circuit according to one embodiment.

FIG. 9 is a detailed view of the column select device 40 shown in FIG. 3 and an I/O equalization circuit 46 for a DRAM 10 according to one embodiment. The column select device 40 operates in the similar manner as discussed above in conjunction with FIG. 8, however, column select device 40 is driven by the translated signal CSEL', described below. Additionally, in the current embodiment, the equalization device 46 is comprised of a low resistance component and a high resistance component.

The low resistance component includes low resistance nMOS transistors 47, 48. As illustrated in FIG. 9, the source and gate of each nMOS transistor 47, 48 is connected to Vcc/2 and an input/output equalization signal (I/OEQ1), respectively. The drain terminal of nMOS transistor 47 is connected to input/output line I/O, whereas the drain terminal of nMOS transistor 48 is connected to input/output line I/O*.

The high resistance component includes nMOS transistors 49, 50 and a high resistance device 51. As illustrated in FIG. 9, the gate of each nMOS transistor 49, 50 is connected to an input/output equalization signal (I/OEQ2). The drain terminal of NMOS transistor 49 is connected to input/output line I/O, whereas the drain terminal of NMOS transistor 50 is connected to input/output line I/O*. The source of each transistor 49, 50 is connected to Vcc/2 through high resistance device 51. In the current embodiment, high resistance device 51 is comprised of a long-length transistor, however other devices may be used while remaining within the scope of the present invention.

Upon entering standby mode, I/OEQ1 turns on to tie the input/output lines I/O, I/O* to Vcc/2 through the low resistance transistors 47, 48. I/OEQ1 then turns off and I/OEQ2 turns on. Thus, the high resistance portion 49, 50, 51 of the equalization device 46 takes the place of the low resistance portion 47, 48. Because I/OEQ2 ties the input/output lines I/O, I/O* to Vcc/2 through the high resistance device 51, the amount of current that will flow through the equalization device 46 during a wordline-to-digitline short is limited.

It should be apparent to one skilled in the art that other circuits and/or control schemes may be used for the low and high resistance portions while remaining within the scope of the present invention. For example, the low resistance portion may remain active until a current sensing device (not shown) senses a fault (e.g., a wordline-to-digitline short), at which time the low resistance portion is deactivated and the high resistance portion is activated.

Furthermore, the current flowing through column select circuit 40 may be reduced by translating the column select control signal to the NEGWL voltage. When using a translated column select control signal (CSEL'), a positive Vgs voltage does not appear on the gates of the nMOS transistors of the column select device 40. Thus, current will not flow through the column select circuit 40 should a wordline-to-digitline short occur. For example, should a wordline-to-digitline short occur which drives digitline D1 to NEGWL, transistor 41 will remain non-conductive because the translated column select signal CSEL' prevents a positive Vgs voltage from appearing across transistor 41. Although the column select device 40 and the I/O equalization circuit 46 are illustrated as being used in combination, it should be apparent to one skilled in the art that the column select device 40 and the I/O equalization circuit 46 may be used separately while remaining within the scope of the present invention.

Figure 10:
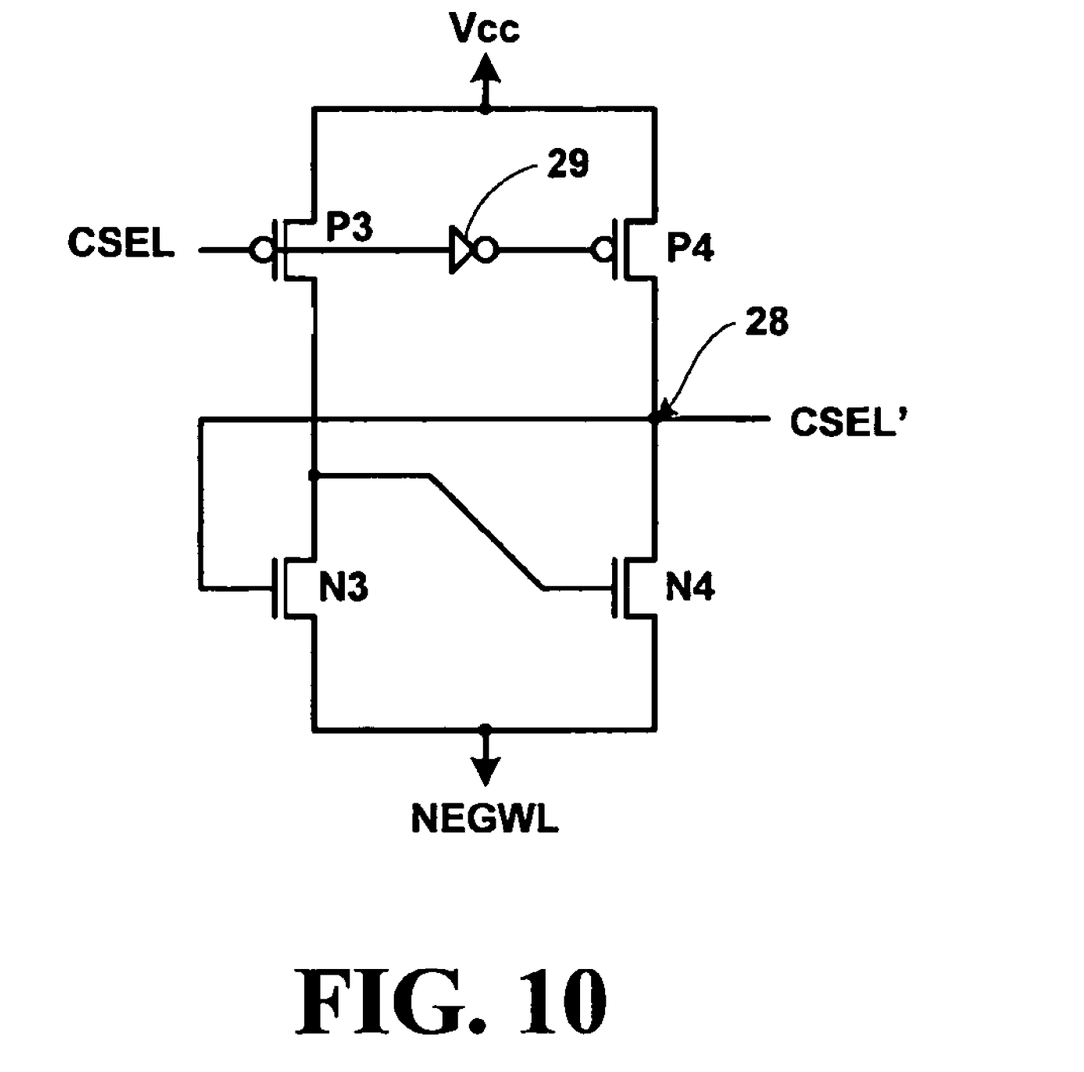
FIG. 10 is a schematic of a circuit for supplying a translated control signal to the column select device of FIG. 9 according to one embodiment.

FIG. 10 is a schematic of a circuit 27 for supplying the translated column select signal (CSEL') to the column select device 40 according to one embodiment. The CSEL translation circuit 27 includes two nMOS transistors (N3, N4), two pMOS transistors (P3, P4) and an inverter 29. The gate and drain of the pMOS transistor P3 are connected to the column select signal CSEL and Vcc, respectively. The gate and drain of the pMOS transistor P4 are connected to the inverted column select signal CSEL (i.e., to the output of inverter 29) and Vcc, respectively. The source of pMOS transistor P3 is connected to the drain of nMOS transistor N3 and to the gate of NMOS transistor N4, whereas the source of pMOS transistor P4 is connected to the drain of nMOS transistor N4, to the gate of nMOS transistor N3, and to the output of the CSEL translation circuit 27 at node 28.

When the CSEL signal is low (e.g., 0V), transistor P3 is turned on and transistor P4 is turned off. Because the gate of transistor N4 is connected to the source of transistor P3, transistor N4 is turned on and the node 28 (and thus the translated column select signal CSEL') is pulled to NEGWL. The transistor N3, whose gate is connected to node 28, remains off. When the CSEL signal is high (e.g., 2V), transistor P3 is turned off and transistor P4 is turned on. Node 28 (and thus the translated column select signal CSEL') is driven to Vcc. Additionally, transistor N3 is turned on and pulls the gate of transistor N4 to NEGWL (thus, transistor N4 remains off.)

Figure 11:
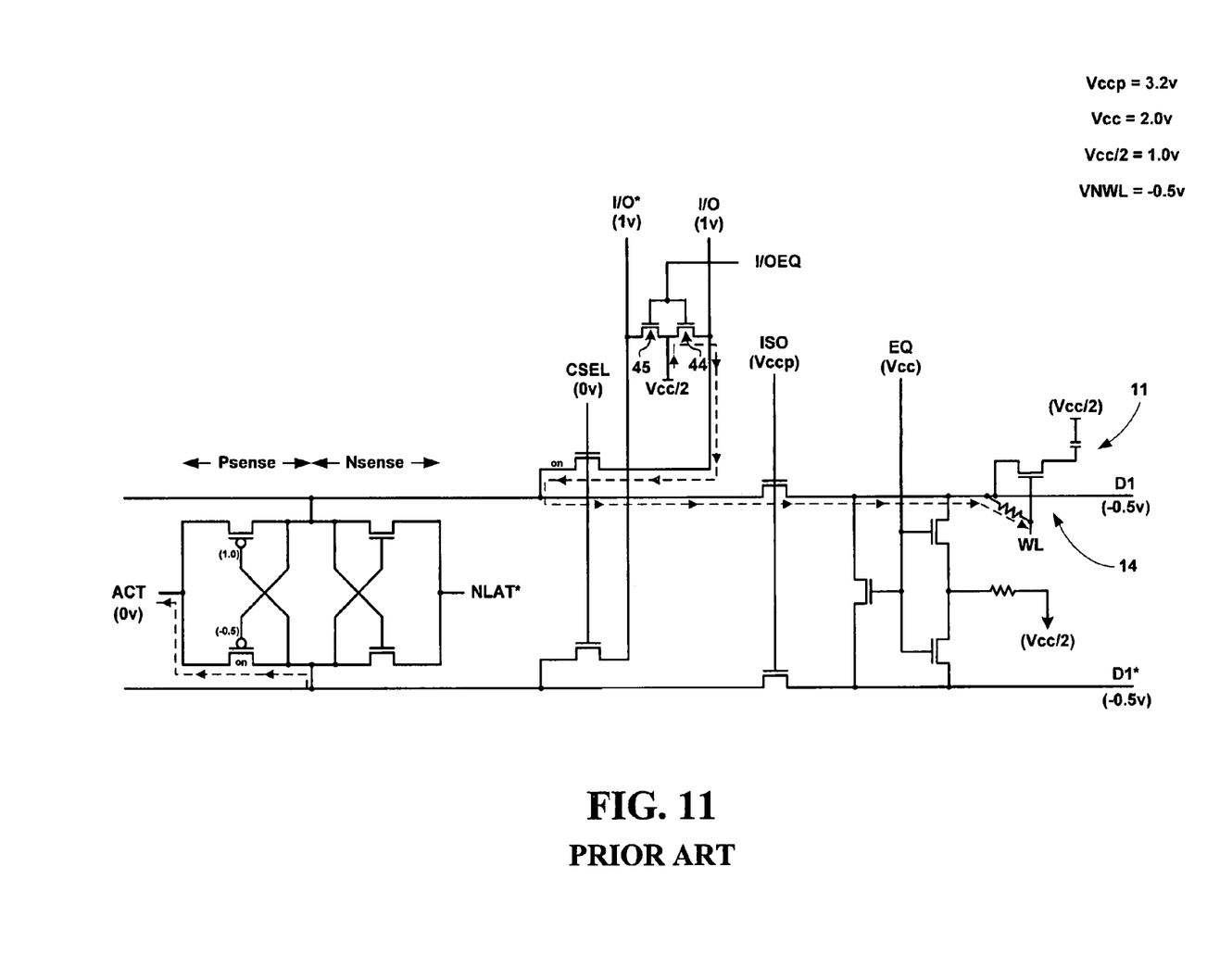
FIG. 11 is a schematic illustrating current leakage through several peripheral devices of a prior art DRAM array having a wordline-to-digitline short.

FIG. 11 is a schematic illustrating current leakage through the peripheral devices of a prior art DRAM having a wordline-to-digitline short. The wordline-to-digitline short is represented by a resistance between the wordline WL and digitline D1 at mbit 11. When the short occurs, the column select transistor connected to digitline D1 begins to conduct (as discussed above in conjunction with FIG. 8) and current (represented by the dashed line) flows from the column select device, across digitline D1, through the short, and onto wordline WL. Additionally in the Psense amplifier, the short causes the pMOS transistor having its gate connected to digitline D1 to begin to conduct (as discussed above in conjunction with FIGS. 4 and 5) and current (represented by the dashed line) flows from digitline D1* to the ACT node.

Figure 12:
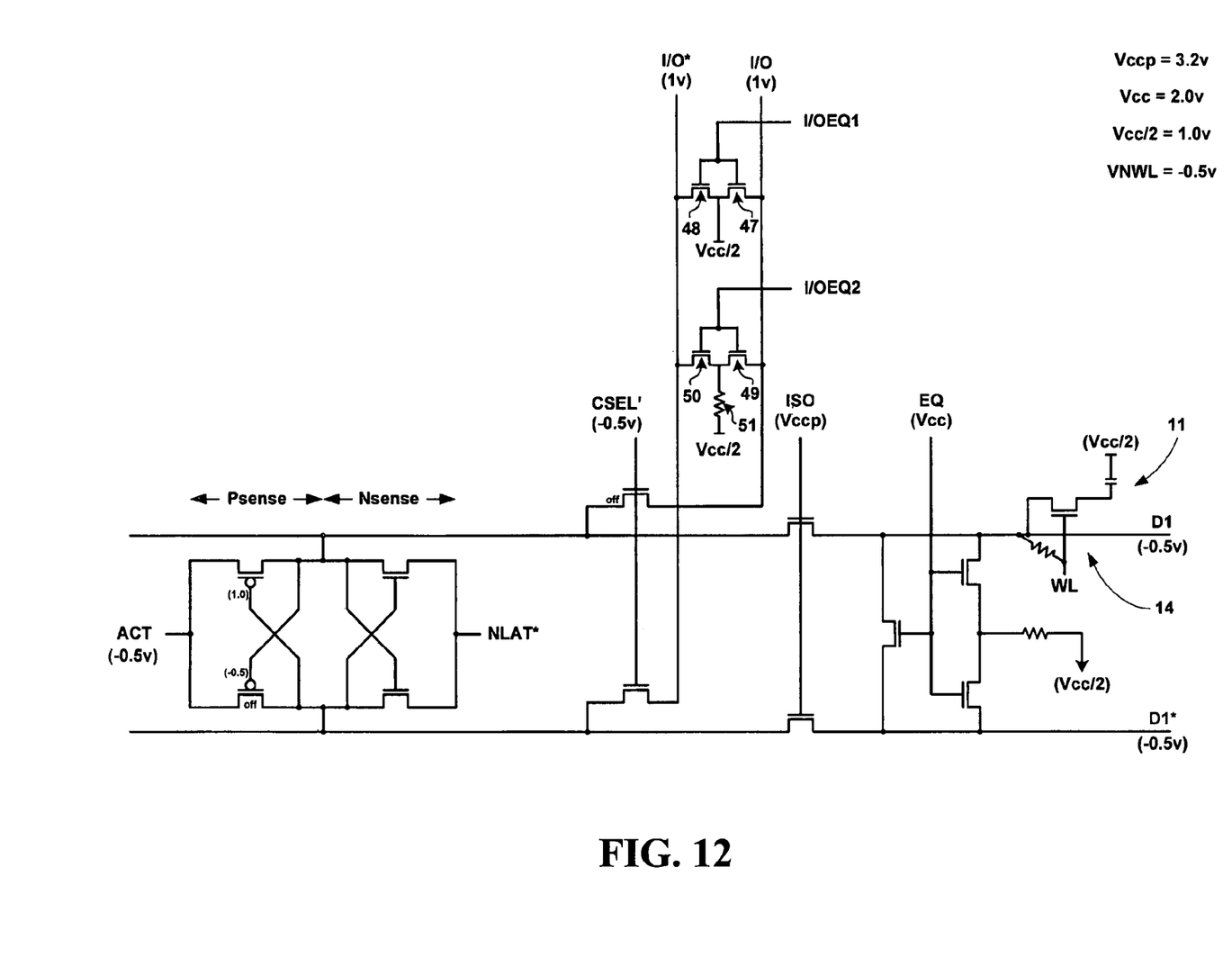
FIG. 12 is a schematic illustrating current leakage through several peripheral devices of a DRAM array having a wordline-to-digitline short according to one embodiment.

FIG. 12 is a schematic illustrating current leakage through the peripheral devices of a DRAM having a wordline-to-digitline short according to one embodiment. As discussed above, in FIG. 12 the wordline-to-digitline short is represented by a resistance between the wordline WL and digitline D1 at mbit 11. When the short occurs, the column select transistor, which has the translated column select signal CSEL' applied to its gate (as discussed in conjunction with FIG. 10), remains off. Thus, current flow through the column select device is eliminated. Alternatively if the column select signal is not translated (i.e., if CSEL is directly applied), the amount of current flowing through the column select circuit is greatly reduce by the high resistance element 51 within the input/output equalization circuit 46 (as discussed above in conjunction with FIG. 9). Additionally, the pMOS transistor (within the Psense amplifier) which has its gate connected to digitline D1 remains off because the active translated pull-up signal ACT' is applied to the Psense amplifier. Thus, current flow from digitline D1* to the ACT node is eliminated.

It should be recognized that the above-described embodiments of the invention are intended to be illustrative only. Numerous alternative embodiments may be devised by those skilled in the art without departing from the scope of the following claims.

What is claimed is:

1. A method for reducing current in a memory device having a plurality of digitlines, a plurality of wordlines driven to a negative wordline voltage, and a peripheral device responsive to a control signal, said method comprising:
translating said control signal to a voltage level that is less than or equal to said negative wordline voltage;
and applying said translated control signal to said peripheral device.

2. The method of claim 1 wherein translating said control signal comprises translating a column select control signal to said voltage level, said peripheral device responsive to said translated column select signal.

3. The method of claim 1 wherein translating said control signal comprises translating an active pull-up control signal to said voltage level and wherein said peripheral device is a sense amplifier responsive to said translated active pull-up control signal.

4. The method of claim 1 wherein said peripheral device includes a transistor having a gate, a source, and a drain and wherein said applying said translated control signal to said peripheral device comprises applying said translated control signal to at least one of said gate, said source, and said drain so as to prevent a source-to-drain current flow within said transistor.

5. The method of claim 1 additionally comprising beginning the precharging of a pair of input/output lines with a first low resistance portion of a circuit and completing the precharging of said pair of input/output lines with a second high resistance portion of said circuit.

6. A method of reducing current in a memory device during a fault condition, said memory device having a plurality of digitlines, a plurality of wordlines driven to a negative wordline voltage, a first peripheral device for equalizing an input/output line pair, and a second peripheral device for connecting a pair of said plurality of digitlines to said input/output line pair, said method comprising:
activating a low resistance portion of said first peripheral device with a first control signal, said activated low resistance portion precharging each line of said input/output pair to a predetermined voltage;
deactivating said low resistance portion of said first peripheral device with said first control signal; and
activating a high resistance portion of said first peripheral device with a second control signal.

7. The method of claim 6 further comprising deactivating said high resistance portion of said first peripheral device with said second control signal.

8. The method of claim 6 wherein said activated low resistance portion precharges each line of said input/output pair to approximately Vcc/2.

9. The method of claim 6 wherein said activated high resistance portion precharges each line of said input/output pair to approximately Vcc/2.

10. The method of claim 6 further comprising:
translating a third control signal to a voltage level that is less than or equal to said negative wordline voltage; and
applying said translated third control signal to said second peripheral device.

11. The method of claim 10 wherein translating said third control signal comprises translating a column select control signal to said voltage level, said second peripheral device being a column select device responsive to said translated column select signal.

12. The method of claim 6 further comprising: translating a third control signal to a voltage level that is less than or equal to said negative wordline voltage; and applying said translated third control signal to another peripheral device.

13. The method of claim 12 wherein translating said third control signal comprises translating an active pull-up control signal to said voltage level, said another peripheral device being a sense amplifier responsive to said active pull-up control signal.

14. A dynamic random access memory, comprising:
a memory array having a plurality of memory cells, wherein each of said memory cells is connected to a wordline and to a digitline in a digitline pair, wherein said wordline is driven to a negative wordline voltage, and wherein said digitline pair is driven to a precharge voltage; and
a plurality of peripheral circuits for reading data into and out of said memory array, certain of said peripheral circuits being connected to said digitline pair, said certain of said peripheral circuits being responsive to a translated control signal which has been translated to a voltage that is less than or equal to said negative wordline voltage.

15. The dynamic random access memory of claim 14 wherein said certain of said peripheral circuits includes a transistor, said translated control signal preventing a source-to-drain current from flowing through said transistor during a wordline-to digitline short.

16. The dynamic random access memory of claim 15 wherein said translated control signal is a column select control signal and said certain of said peripheral circuits include a column select circuit.

17. The dynamic random access memory of claim 15 wherein said translated control signal is an active pull-up control signal and said certain of said peripheral circuits includes a sense amplifier.

18. The dynamic random access memory of claim 14 wherein said certain of said peripheral circuits includes an input/output equalization circuit having a low resistance portion activated by a first control signal and a high resistance portion activated by a second control signal.

19. An input/output equalization device operable to reduce the amount of current flow in a memory device during a fault condition, comprising:
a low resistance portion responsive to a first control signal; and
a high resistance portion responsive to a second control signal.

20. The input/output equalization device of claim 19 wherein said low resistance portion includes a plurality of transistors spanning an input/output line pair, said plurality of transistors being gated by said first control signal and being operable to electrically connect said input/output line pair to a voltage source.

21. The input/output equalization device of claim 19 wherein said high resistance portion includes a high resistance device and a plurality of transistors, said plurality of transistors spanning an input/output line pair, gated by said second control signal, and operable to electrically connect said input/output line pair to a voltage source through said high resistance device.

22. A dynamic random access memory, comprising:
   a memory array having a plurality of memory cells connected to a plurality of wordlines and a plurality of digitlines, wherein said plurality of wordlines are driven to a predetermined voltage level and wherein said plurality of digitlines are driven to a precharge voltage level;
   a plurality of peripheral circuits for reading data into and out of said memory array, said peripheral circuits comprising:
      a sense amplifier connected to one or more of said digitlines, said sense amplifier operable to sense a charge stored by a memory cell connected to said one or more of said digitlines, said sense amplifier comprising:
         an Nsense amplifier portion responsive to a first control signal, wherein said first control signal is driven to said precharge voltage level; and
         a Psense amplifier portion responsive to a second control signal, wherein said second control signal is translated to a first voltage and wherein said first voltage is less than or equal to said predetermined voltage level; and
      a plurality of input/output lines, each of said plurality of input/output lines connected to one or more of said digitlines via a column select device responsive to a third control signal, wherein said third control signal is translated to a second voltage and wherein said second voltage is less than or equal to said predetermined voltage level.

23. The apparatus of claim 22 wherein said predetermined voltage level is a negative wordline voltage.

24. The apparatus of claim 22 wherein said precharge voltage is approximately equal to Vcc/2.

25. The apparatus of claim 22 wherein said Nsense amplifier includes a first nMOS transistor and a second nMOS transistor, wherein said first control signal is applied to a source terminal of said first nMOS transistor and a source terminal of said second nMOS transistor, wherein a gate terminal of said first nMOS transistor and a drain terminal of said second nMOS transistor are connected to a first digitline, and wherein a gate terminal of said second nMOS transistor and a drain terminal of said first nMOS transistor are connected to a second digitline.

26. The apparatus of claim 22 wherein said Psense amplifier includes a first pMOS transistor and a second pMOS transistor, wherein said second control signal is applied to a source terminal of said first pMOS transistor and a source terminal of said second pMOS transistor, wherein a gate terminal of said first pMOS transistor and a drain terminal of said second pMOS transistor are connected to a first digitline, and wherein a gate terminal of said second pMOS transistor and a drain terminal of said first pMOS transistor are connected to a second digitline.

27. A method for reducing the power consumption of a dynamic random access memory (DRAM) array, comprising:
   driving a plurality of wordlines to a predetermined voltage level when said wordlines are deactivated;
   translating one or more control signals to a first voltage level, wherein said first voltage level is less than or equal to said predetermined voltage level; and
   applying said one or more control signals to at least one peripheral circuit when said wordlines are deactivated.

28. A sense amplifier circuit connected to one or more digitlines in a dynamic random access memory, said sense amplifier operable to sense a charge stored by one or more memory cells connected to said one or more digitlines, said sense amplifier comprising:
   an Nsense amplifier responsive to a first control signal, wherein said first control signal is driven to a precharge voltage level in said standby mode; and
   a Psense amplifier responsive to a second control signal, wherein said second control signal is translated to a first voltage, wherein said first voltage is less than or equal to a predetermined voltage level.

29. A method for reducing current through a peripheral device for a memory array, said peripheral device being responsive to a control signal, said method comprising:
   translating said control signal to a voltage level such that said peripheral device is rendered non-conductive to reduce a fault current through said peripheral device.

30. The method of claim 29 wherein said peripheral device is non-conductive in the presence of a wordline-to-digitline short circuit.

31. The method of claim 29 wherein said peripheral device includes a pMOS transistor having its source connected to said translated control signal, wherein said translated control signal renders said pMOS transistor non-conductive by preventing a negative gate to source voltage on said pMOS transistor.

32. The method of claim 29 wherein said peripheral device includes a nMOS transistor gated by said translated control signal, wherein said translated control signal renders said nMOS transistor non-conductive by preventing a positive gate to source voltage on said nMOS transistor.

* * * * *

UNITED STATES PATENT AND TRADEMARK OFFICE
CERTIFICATE OF CORRECTION

| | | |
|---|---|---|
| PATENT NO. | : 7,142,446 B2 | Page 1 of 1 |
| APPLICATION NO. | : 10/902728 | |
| DATED | : November 28, 2006 | |
| INVENTOR(S) | : Scott J. Derner et al. | |

It is certified that error appears in the above-identified patent and that said Letters Patent is hereby corrected as shown below:

Column 1, Line 33, delete "though" and substitute therefore --through--.

Column 1, Line 47, delete "though" and substitute therefore --through--.

Column 2, Line 11, after "according" insert --to--.

Column 2, Line 26, after "according" insert --to--.

Column 11, Lines 27-28, delete "inputloutput" and substitute therefore --input/output--.

Signed and Sealed this

Eighteenth Day of March, 2008

JON W. DUDAS
*Director of the United States Patent and Trademark Office*